United States Patent
Kong et al.

(10) Patent No.: US 11,972,837 B2
(45) Date of Patent: Apr. 30, 2024

(54) DATA SAMPLING CIRCUIT AND DATA TRANSMITTER CIRCUIT

(71) Applicant: SK hynix Inc., Gyeonggi-do (KR)

(72) Inventors: Inseok Kong, Gyeonggi-do (KR); Jaehyeong Hong, Gyeonggi-do (KR); Min Su Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 183 days.

(21) Appl. No.: 17/847,918

(22) Filed: Jun. 23, 2022

(65) Prior Publication Data
US 2023/0298644 A1  Sep. 21, 2023

(30) Foreign Application Priority Data
Mar. 17, 2022 (KR) ........................ 10-2022-0033508

(51) Int. Cl.
*G11C 7/00* (2006.01)
*G11C 7/10* (2006.01)
*G11C 7/22* (2006.01)
*H03K 19/017* (2006.01)

(52) U.S. Cl.
CPC ............ *G11C 7/222* (2013.01); *G11C 7/1063* (2013.01); *G11C 7/109* (2013.01); *H03K 19/01742* (2013.01)

(58) Field of Classification Search
CPC ... G11C 7/1051; G11C 7/1048; G11C 7/1078; G11C 7/1057; G11C 7/1084

USPC ......................................................... 365/198
See application file for complete search history.

(56) References Cited

U.S. PATENT DOCUMENTS 11,251,934 B2 *  2/2022  Ulrich .................. H04L 7/0054
2021/0157355 A1  5/2021  Sarda

FOREIGN PATENT DOCUMENTS

KR  10-2007-0015094 A  2/2007

OTHER PUBLICATIONS

Ashwin Ramachandran et al., An iPWM Line-Coding-Based Wireline Transceiver With Clock-Domain Encoding for Compensating Up To 27-dB Loss While Operating at 0.5-to-0.9 V and 3-to-16 Gb/s in 65-nm CMOS, IEEE Journal of Solid-State Circuits, Jul. 2020, p. 1946-1959, vol. 55, No. 7, IEEE.

* cited by examiner

*Primary Examiner* — Son T Dinh
(74) *Attorney, Agent, or Firm* — IP & T GROUP LLP (57) ABSTRACT

A data sampling circuit may include a pattern detection circuit configured to generate a slow signal by detecting a pattern of multibit data including input data, and a sampling circuit configured to sample the input data during an activation period of a sampling clock and having an operating speed of the sampling circuit reduced when the slow signal is activated.

20 Claims, 7 Drawing Sheets

DATA SAMPLING CIRCUIT AND DATA TRANSMITTER CIRCUIT

CROSS-REFERENCE TO RELATED APPLICATION

This application claims priority under 35 U.S.C. § 119 to Korean Patent Application No. 10-2022-0033508 filed on Mar. 17, 2022, which is incorporated herein by reference in its entirety.

BACKGROUND

1. Field

The present disclosure relates to a transmitter circuit used by various integrated circuits in order to transmit data (signals).

2. Discussion of the Related Art

Various integrated circuits do not operate alone, but operate by exchanging data (signals) with surrounding chips. For example, memory chips such as DRAM and Flash exchange data with a memory controller, and a CPU also exchanges data with various chips on a motherboard. Furthermore, signal transmission is not performed only from chip-to-chip, and is also performed between circuits A and B (A and B refer to arbitrary circuits) in one integrated circuit chip. A circuit that transmits data (signals) is referred to as a transmitter circuit or an output driver.

As operating speeds of integrated circuits increase and data rates of data (signals) transmitted by a transmitter circuit increase, it is increasingly required to perform various operations in order to improve the quality of data (signals) transmitted by the transmitter circuit.

SUMMARY

Various embodiments of the present disclosure are directed to providing a technology of improving the quality of transmission data by using a simple structure without increasing current consumption.

A data sampling circuit in accordance with an embodiment of the present disclosure may include: a pattern detection circuit configured to generate a speed control signal by detecting a pattern of multibit data including input data; and a sampling circuit configured to sample the input data during an activation period of a sampling clock, and reduce an operating speed thereof when the speed control signal is activated.

A data transmitter circuit in accordance with another embodiment of the present disclosure may include: a plurality of pattern detection circuits configured to generate a plurality of speed control signals by detecting a pattern of multibit data; a plurality of sampling circuits configured to sample the multibit data respectively corresponding to the plurality of sampling circuits during activation periods of sampling clocks respectively corresponding to the plurality of sampling circuits, and reduce respective operating speeds of the sampling circuits when respective speed control signals corresponding to the sampling circuits are activated; and a parallel-to-serial conversion circuit configured to perform parallel-to-serial conversion on the sampled data to output the converted data to an output node.

A data transmitter circuit in accordance with further another embodiment of the present disclosure may include: first to fourth pattern detection circuits configured to activate first to fourth speed control signals by using first to fourth data corresponding to the first to fourth pattern detection circuits, respectively, each piece of the first to fourth data being multibit; a first sampling circuit configured to sample the first data during an activation period of a first sampling clock and reduce an operating speed of the first sampling circuit when the first speed control signal is activated; a second sampling circuit configured to sample the second data during an activation period of a second sampling clock and reduce an operating speed of the second sampling circuit when the second speed control signal is activated; a third sampling circuit configured to sample the third data during an activation period of a third sampling clock and reduce an operating speed of the third sampling circuit when the third speed control signal is activated; a fourth sampling circuit configured to sample the fourth data during an activation period of a fourth sampling clock and reduce an operating speed of the fourth sampling circuit when the fourth speed control signal is activated; and a parallel-to-serial conversion circuit configured to perform parallel-to-serial conversion on the sampled data to output the converted data to an output node.

A data transmitter circuit in accordance with still another embodiment of the present disclosure may include: N number of data sampling circuits suitable for receiving parallel N number of data signals having different phases to output parallel N number of sampled signals, respectively; and a converting circuit suitable for converting the sampled signals into a serial signal, wherein each of the data sampling circuits includes: a pattern detecting circuit suitable for detecting, during consecutively activated periods of three or more among N number of sampling clocks, a consecutive level change between three or more data signals having adjacent phases and including a corresponding data signal among the N number of data signals; and a sampling circuit suitable for: sampling the corresponding data signal according to a corresponding sampling clock of the N number of sampling clocks to output a corresponding sampling signal of the N number of sampled signals, and reducing a speed of the sampling in response to the detecting.

In accordance with embodiments of the present disclosure, it is possible to improve the quality of transmission data by using a simple structure without increasing current consumption.

DETAILED DESCRIPTION

Hereinafter, in order to describe in detail the present disclosure to the extent that a person skilled in the art to which the present disclosure pertains can easily implement the technical idea of the present disclosure, the most preferred embodiment of the present disclosure will be described with reference to the accompanying drawings. In describing the present disclosure, publicly-known configurations irrelevant to the subject matter of the present disclosure may be omitted. In adding reference numerals to components of each drawing, it should be noted that only the same components are given the same reference numerals when possible even though they are illustrated on different drawings.

Figure 1:
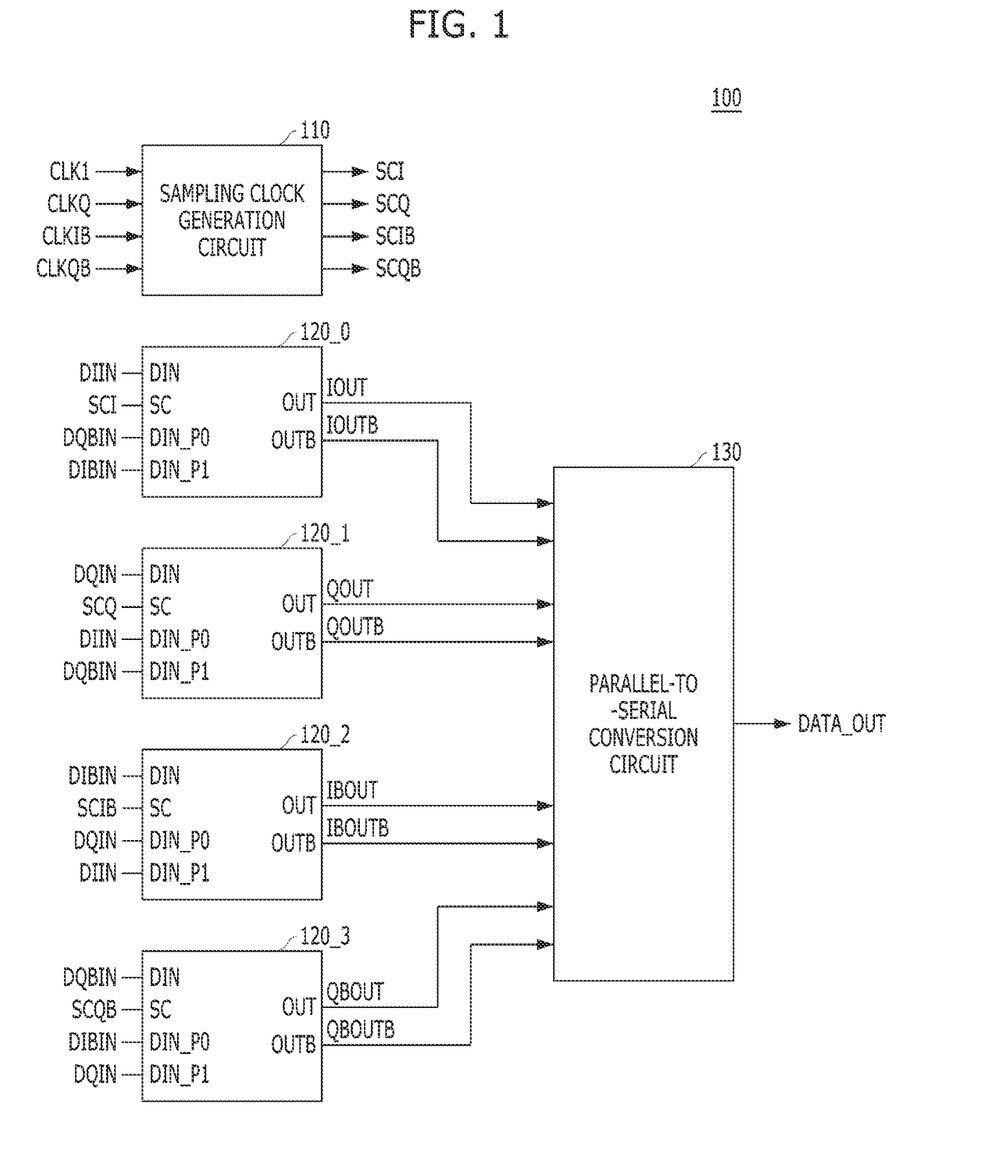
FIG. 1 is a configuration diagram of a data transmitter circuit 100 in accordance with an embodiment of the present disclosure.

FIG. 1 is a configuration diagram of a data transmitter circuit 100 in accordance with an embodiment of the present disclosure. The data transmitter circuit 100 may be used to transmit data (signals) between different integrated circuit chips or within one integrated circuit chip.

Referring to FIG. 1, the data transmitter circuit 100 may include a sampling clock generation circuit 110, first to fourth data sampling circuits 120_0 to 120_3, and a parallel-to-serial conversion circuit 130.

First to fourth data DIIN, DQIN, DIBIN, and DQBIN, which are parallel data, may be data to be transmitted by the data transmitter circuit 100. First to fourth clocks CLKI, CLKQ, CLKIB, and CLKQB may clocks for strobing the first to fourth data DIIN, DQIN, DIBIN, and DQBIN. The first to fourth clocks CLKI, CLKQ, CLKIB, and CLKQB may have different phases. That is, the first to fourth clocks CLKI, CLKQ, CLKIB, and CLKQB may have a phase difference of 90° from each other.

The sampling clock generation circuit 110 may generate first to fourth sampling clocks SCI, SCQ, SCIB, and SCQB by using the first to fourth clocks CLKI, CLKQ, CLKIB, and CLKQB. The first to fourth sampling clocks SCI, SCQ, SCIB, and SCQB may be clocks which the first to fourth data sampling circuits 120_0 to 120_3 use for sampling the first to fourth data DIIN, DQIN, DIBIN, and DQBIN, respectively.

The first to fourth data sampling circuits 120_0 to 120_3 may sample the first to fourth data DIIN, DQIN, DIBIN, and DQBIN by using the first to fourth sampling clocks SCI, SCQ, SCIB, and SCQB, respectively. The first to fourth data sampling circuits 120_0 to 120_3 may detect patterns of the first to fourth data DIIN, DQIN, DIBIN, and DQBIN, and slow their own sampling speeds in a period in which pre-emphasis is determined to be required, thereby implementing the pre-emphasis at an output terminal DATA_OUT of the data transmitter circuit 100. Data IOUT, IOUTB, QOUT, QOUTB, IBOUT, IBOUTB, QBOUT, and QBOUTB sampled by the first to fourth data sampling circuits 120_0 to 120_3 may be outputted in a differential form. In FIG. 1, DIN may indicate a terminal to which data to be sampled is inputted, SC may indicate a terminal to which a sampling clock is inputted, DIN_P0 may indicate a terminal to which data immediately before the data inputted to DIN is inputted, DIN_P1 may indicate a terminal to which data immediately before the data inputted to DIN_P0 is inputted, and OUT and OUTB may indicate terminals from which sampled differential data are outputted. Referring to DIN, SC, DIN_P0, and DIN_P1 in FIG. 1, it can be seen which signals are inputted to the first to fourth data sampling circuits 120_0 to 120_3.

The first to fourth data sampling circuits 120_0 to 120_3 may serve as level shifters depending on a system including the data transmitter circuit 100. For example, signals inputted to the first to fourth data sampling circuits 120_0 to 120_3 may swing to a level of a ground voltage to a first power supply voltage VDD1, and signals outputted from the first to fourth data sampling circuits 120_0 to 120_3 may swing to a level of the ground voltage to a second power supply voltage VDD2. The levels of the first power supply voltage VDD1 and the second power supply voltage VDD2 may be different from each other.

The parallel-to-serial conversion circuit 130 may perform parallel-to-serial conversion on the data IOUT, IOUTB, QOUT, QOUTB, IBOUT, IBOUTB, QBOUT, and QBOUTB sampled by the first to fourth data sampling circuits 120_0 to 120_3, and output the converted data to the output terminal DATA_OUT.

FIG. 1 illustrates that the number of the first to fourth data sampling circuits 120_0 to 120_3 is four and a 4:1 parallel-to-serial conversion operation is performed by the parallel-to-serial conversion circuit 130; however, this is only an example and it is of course that the number of the data sampling circuits 120 is N, where N is an integer equal to or greater than 2, and the parallel-to-serial conversion circuit 130 may perform an N:1 parallel-to-serial conversion operation.

Figure 2:
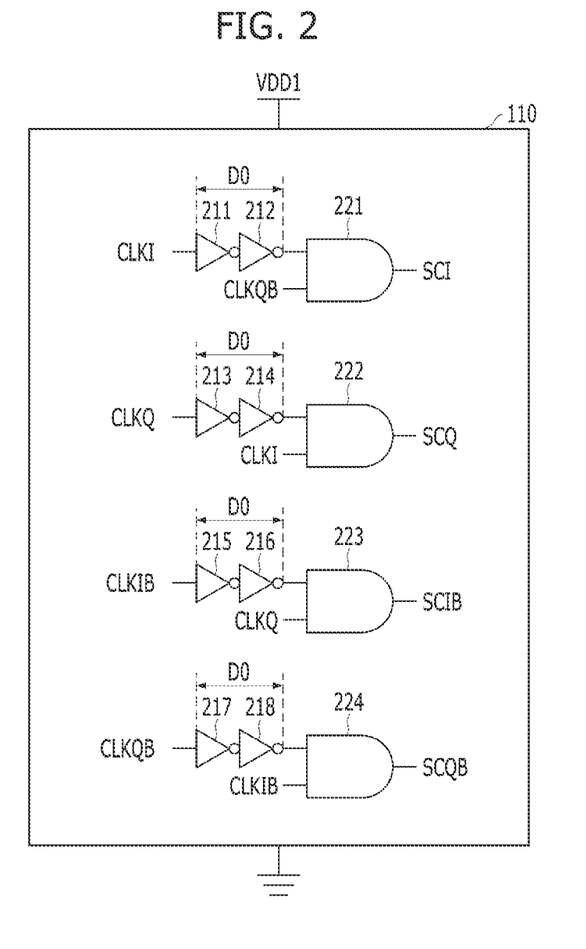
FIG. 2 is a configuration diagram of a sampling clock generation circuit 110 in FIG. 1 in accordance with an embodiment of the present disclosure.
Figure 3:
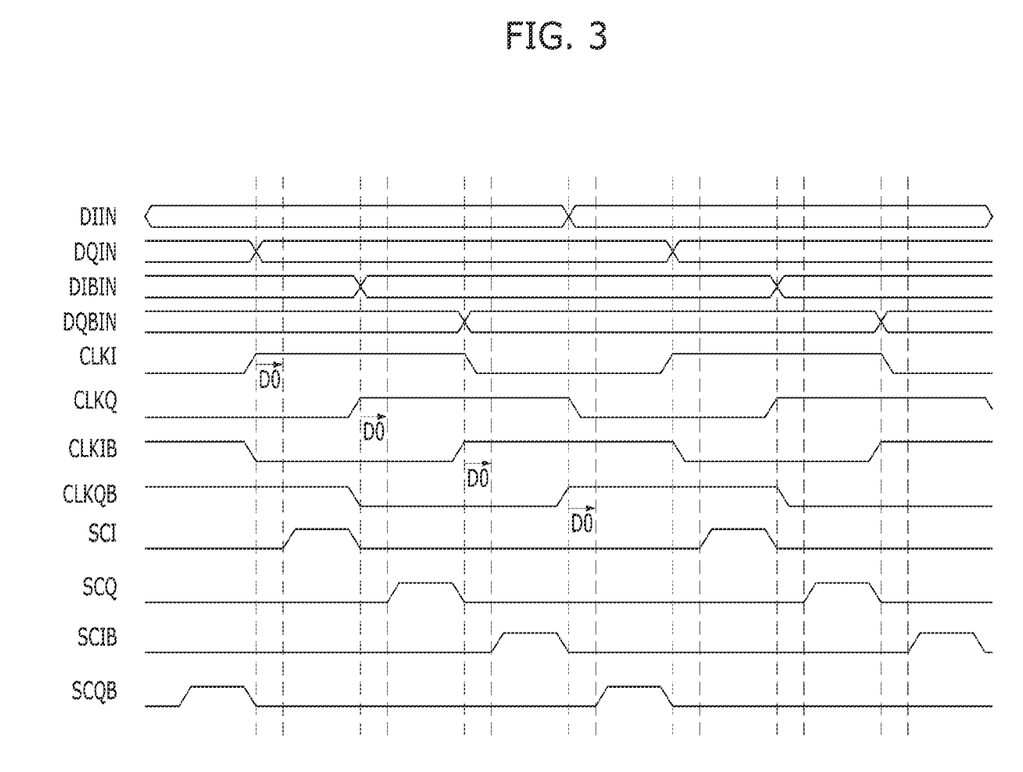
FIG. 3 is a timing diagram for describing an operation in FIG. 2 in accordance with an embodiment of the present disclosure.

FIG. 2 is a configuration diagram of the sampling clock generation circuit 110 in FIG. 1 in accordance with an embodiment of the present disclosure, and FIG. 3 is a timing diagram for describing the operation of the sampling clock generation circuit 110 in accordance with an embodiment of the present disclosure.

Referring to FIG. 2, the sampling clock generation circuit 110 may include inverters 211 to 218 and AND gates 221 to 224. The first to fourth clocks CLKI, CLKQ, CLKIB, and CLKQB may swing to the level of the ground voltage to the first power supply voltage VDD1, and the sampling clock generation circuit 110 may operate by using the ground voltage and the first power supply voltage VDD1.

The inverters 211 and 212 may delay the first clock CLKI. A delay value of the inverters 211 and 212 is denoted as D0. The AND gate 221 may generate the first sampling clock SCI that is activated to '1' in a period in which the first clock CLKI delayed by the inverters 211 and 212 and the fourth clock CLKQB are '1' (high). Referring to FIG. 3, it can be seen that a rising edge of the first sampling clock SCI is delayed by D0 from a rising edge of the first clock CLKI and the timing of a falling edge of the first sampling clock SCI is the same as the timing of a falling edge of the fourth clock CLKQB. Furthermore, Referring to FIG. 3, the relationship between the first to fourth data DIIN, DQIN, DIBIN, and DQBIN and the first to fourth clocks CLKI, CLKQ, CLKIB, and CLKQB may also be known.

The inverters 213 and 214 may delay the second clock CLKQ. A delay value of the inverters 213 and 214 is denoted as D0. The AND gate 222 may generate the second sampling clock SCQ that is activated to '1' in a period in which the second clock CLKQ delayed by the inverters 213 and 214 and the first clock CLKI are '1'. Referring to FIG. 3, it can be seen that a rising edge of the second sampling clock SCQ is delayed by D0 from a rising edge of the second clock CLKQ and the timing of a falling edge of the second sampling clock SCQ is the same as the timing of a falling edge of the first clock CLKI.

The inverters 215 and 216 may delay the third clock CLKIB. A delay value of the inverters 215 and 216 is denoted as D0. The AND gate 223 may generate the third sampling clock SCIB that is activated to '1' in a period in which the third clock CLKIB delayed by the inverters 215 and 216 and the second clock CLKQ are '1'. Referring to FIG. 3, it can be seen that a rising edge of the third sampling clock SCIB is delayed by D0 from a rising edge of the third clock CLKIB and the timing of a falling edge of the third sampling clock SCIB is the same as the timing of a falling edge of the second clock CLKQ.

The inverters 217 and 218 may delay the fourth clock CLKQB. A delay value of the inverters 217 and 218 is denoted as D0. The AND gate 224 may generate the fourth sampling clock SCQB that is activated to '1' in a period in which the fourth clock CLKQB delayed by the inverters 217 and 218 and the third clock CLKIB are '1'. Referring to FIG. 3, it can be seen that a rising edge of the fourth sampling clock SCQB is delayed by D0 from a rising edge of the fourth clock CLKQB and the timing of a falling edge of the fourth sampling clock SCQB is the same as the timing of a falling edge of the third clock CLKIB.

Figure 4:
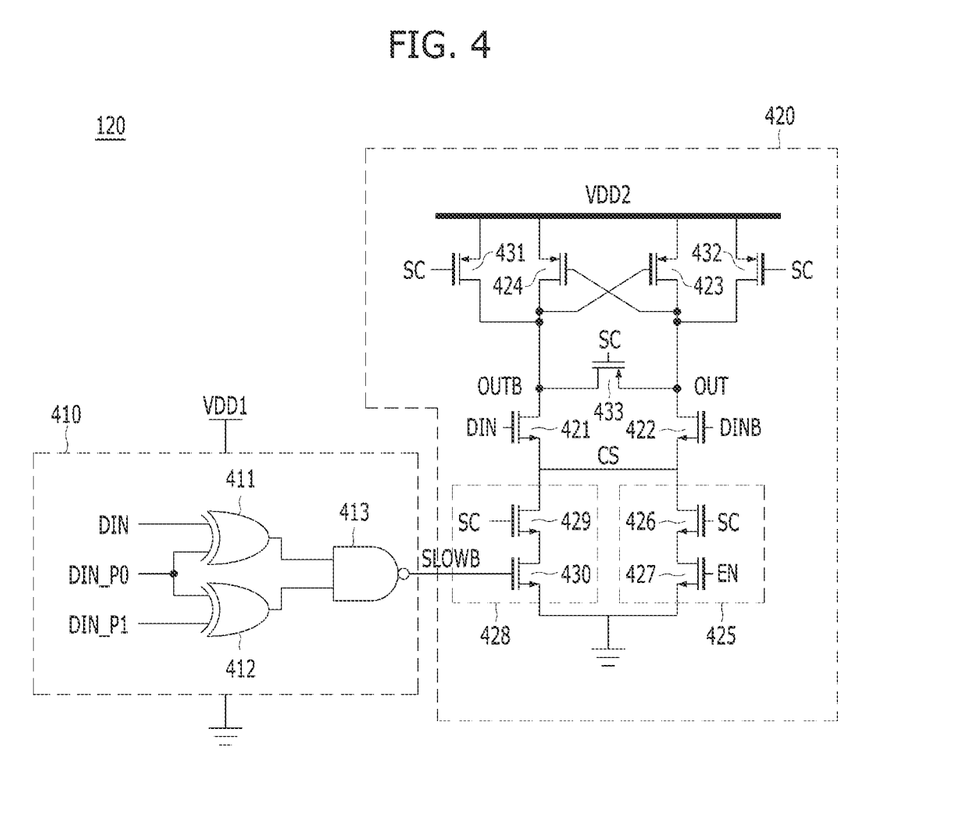
FIG. 4 is a configuration diagram of a data sampling circuit 120 in FIG. 1 in accordance with an embodiment of the present disclosure.

FIG. 4 is a configuration diagram of the data sampling circuit 120 in FIG. 1 in accordance with an embodiment of the present disclosure. Since signals inputted to terminals are different for each of the data sampling circuits 120_0 to 120_3 in FIG. 1, the data sampling circuit 120 will be described based on the terminals in FIG. 4.

Referring to FIG. 4, the data sampling circuit 120 may include a pattern detection circuit 410 and a sampling circuit 420.

The pattern detection circuit 410 may activate a speed control signal SLOWB to '0' when data of the terminal DIN and data of the terminal DIN_P0 are different from each other and the data of the terminal DIN_P0 and data of the terminal DIN_P1 are different from each other. The pattern detection circuit 410 may include XOR gates 411 and 412 and a NAND gate 413. When the data of the terminal DIN and the data of the terminal DIN_P0 are different from each other, the output of the XOR gate 411 may be '1', and when the data of the terminal DIN_P0 and the data of the terminal DIN_P1 are different from each other, the output of the XOR gate 412 may be '1'. When the outputs of the XOR gates 411 and 412 are both '1', the speed control signal SLOWB outputted from the NAND gate 413 may be activated to '0'. That is, when the data pattern of DIN_P1, DIN_P0, and DIN is (0, 1, 0) or (1, 0, 1), the pattern detection circuit 410 may activate the speed control signal SLOWB to '0'. The pattern detection circuit 410 may operate by using the ground voltage and the first power supply voltage VDD1.

The pattern detection circuit 410 of the first data sampling circuit 120_0 may activate the speed control signal SLOWB to '0' when the pattern of the third, fourth, and first data DIBIN, DQBIN, and DIIN is (0, 1, 0) or (1, 0, 1). Furthermore, the pattern detection circuit 410 of the second data sampling circuit 120_1 may activate the speed control signal SLOWB to '0' when the pattern of the fourth, first, and second data DQBIN, DIIN, and DQIN is (0, 1, 0) or (1, 0, 1). Furthermore, the pattern detection circuit 410 of the third data sampling circuit 120_2 may activate the speed control signal SLOWB to '0' when the pattern of the first, second, and third data DIIN, DQIN, and DIBIN is (0, 1, 0) or (1, 0, 1). Furthermore, the pattern detection circuit 410 of the fourth data sampling circuit 120_3 may activate the speed control signal SLOWB to '0' when the pattern of the second, third, and fourth data DQIN, DIBIN, and DQBIN is (0, 1, 0) or (1, 0, 1).

The sampling circuit 420 may sample and amplify the data of the terminal DIN while the sampling clock of the terminal SC is '1', and may be reset while the sampling clock of the terminal SC is '0'. In the sampling circuit 420, the amount of operating current may be increased while the speed control signal SLOWB is deactivated to '1' and decreased while the speed control signal SLOWB is activated to '0'. That is, the sampling circuit 420 may operate at a relatively fast speed while the speed control signal SLOWB is deactivated to '1' and operate at a relatively slow speed while the speed control signal SLOWB is activated to '0'. On the other hand, the sampling circuit 420 may reset the output terminals OUT and OUTB to the level of the second power supply voltage VDD2 while the sampling clock of the terminal SC is '0'. The sampling circuit 420 may operate by using the ground voltage and the second power supply voltage VDD2. Accordingly, the data of the output terminals OUT and OUTB of the sampling circuit 420 may swing to the level of 0 to VDD2.

The sampling circuit 420 may include an input unit 421, an input bar unit 422, a first pull-up driving unit 423, a second pull-up driving unit 424, a first sinking unit 425, a second sinking unit 428, and transistors 431 to 433 for a reset operation.

The input unit 421 may sink current from the terminal OUTB, from which output bar data is outputted, to a common source node CS in response to data inputted to the terminal DIN. Accordingly, as the voltage of the terminal DIN increases, the voltage of the terminal OUTB may decrease. The input unit 421 may be an NMOS transistor.

The input bar unit 422 may sink current from the terminal OUT, from which output data is outputted, to the common source node CS in response to data of the terminal DINB. The data of the terminal DINB may be data obtained by inverting the data of the terminal DIN. As the voltage of the terminal DINB increases, the voltage of the terminal OUT may decrease. The input bar unit 422 may be an NMOS transistor.

The first pull-up driving part 423 may pull up the terminal OUT in response to a voltage level of the terminal OUTB, and the second pull-up driving part 424 may pull up the terminal OUTB in response to a voltage level of the terminal OUT. The voltages of the terminals OUT and OUTB may be differentially amplified by the operations of the first pull-up driving unit 423 and the second pull-up driving unit 424. Each of the first pull-up driving unit 423 and the second pull-up driving unit 424 may be a PMOS transistor.

The first sinking part 425 may sink current from the common source node CS to a ground terminal. The first sinking part 425 may be activated when the sampling clock of the terminal SC is '1' and may be deactivated when the sampling clock of the terminal SC is '0'. The first sinking part 425 may include two NMOS transistors 426 and 427 connected in series. The NMOS transistor 426 may be turned on when the sampling clock of the terminal SC is '1' and may be turned off when the sampling clock of the terminal SC is '0'. The NMOS transistor 427 receives an activation signal EN and the activation signal EN is a signal that always maintains the level of '1' when the sampling circuit 420 is operating. Accordingly, the NMOS transistor 427 may always be turned on.

The second sinking part 428 may sink current from the common source node CS to the ground terminal when the speed control signal SLOWB is deactivated to '1'. The second sinking part 428 may be activated when the sampling clock of the terminal SC is '1' and may be deactivated when the sampling clock of the terminal SC is '0'. The second sinking part 428 may include two NMOS transistors 429 and 430 connected in series. The NMOS transistor 429 may be turned on when the sampling clock of the terminal SC is '1' and may be turned off when the sampling clock of the terminal SC is '0'. The NMOS transistor 430 may be turned on when the speed control signal SLOWB is deactivated to '1' and may be turned off when the speed control signal SLOWB is activated to '0'. That is, the second sinking part 428 may sink current from the common source node CS to the ground terminal when the speed control signal SLOWB is deactivated to '1' and the sampling clock of the terminal SC is '1'. Since the second sinking part 428 performs the sinking operation only when the speed control signal SLOWB is deactivated to '1', the amount of operating current of the sampling circuit 420 may increase when the speed control signal SLOWB is deactivated to '1' and may decrease when the speed control signal SLOWB is activated to '0'.

The PMOS transistor 431 may reset the output bar terminal OUTB to the level of the second power supply voltage VDD2 when the sampling clock of the terminal SC is '0', and the PMOS transistor 432 may reset the output terminal OUT to the level of the second power supply voltage VDD2 when the sampling clock of the terminal SC is '0'. Furthermore, the PMOS transistor 433 may equalize the output terminal OUT and the output bar terminal OUTB when the sampling clock of the terminal SC is '0'.

Figure 6:
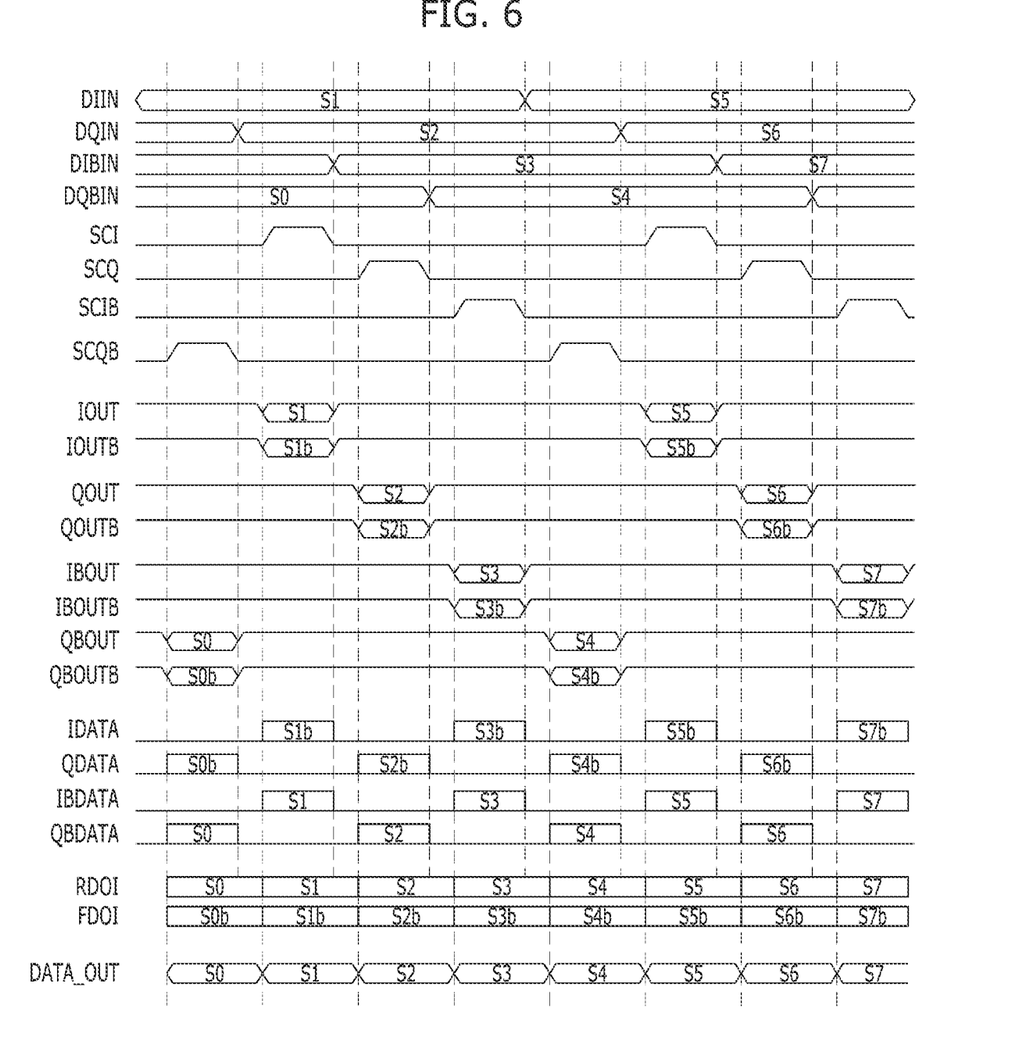
FIG. 6 is a timing diagram for describing operations in FIG. 4 and FIG. 5 in accordance with an embodiment of the present disclosure.

Referring to FIG. 6, it can be seen that the data sampling circuit 120_0 samples the first data DIIN when the first sampling clock SCI is '1', and thus generates the output data IOUT and IOUTB. It can be seen that the output data IOUT and IOUTB have a level according to the first data DIIN while the first sampling clock SCI is '1', and are reset to '1' while the first sampling clock SCI is '0'. Similarly, in FIG. 6, it can be seen that the second to fourth data sampling circuits 120_1 to 120_3 sample the second to fourth data DQIN, DIBIN, and DQBIN when the second to fourth sampling clocks SCQ, SCIB, and SCQB are '1', and thus generate the output data QOUT and QOUTB, IBOUT and IBOUTB, and QBOUT and QBOUTB, respectively.

Figure 5:
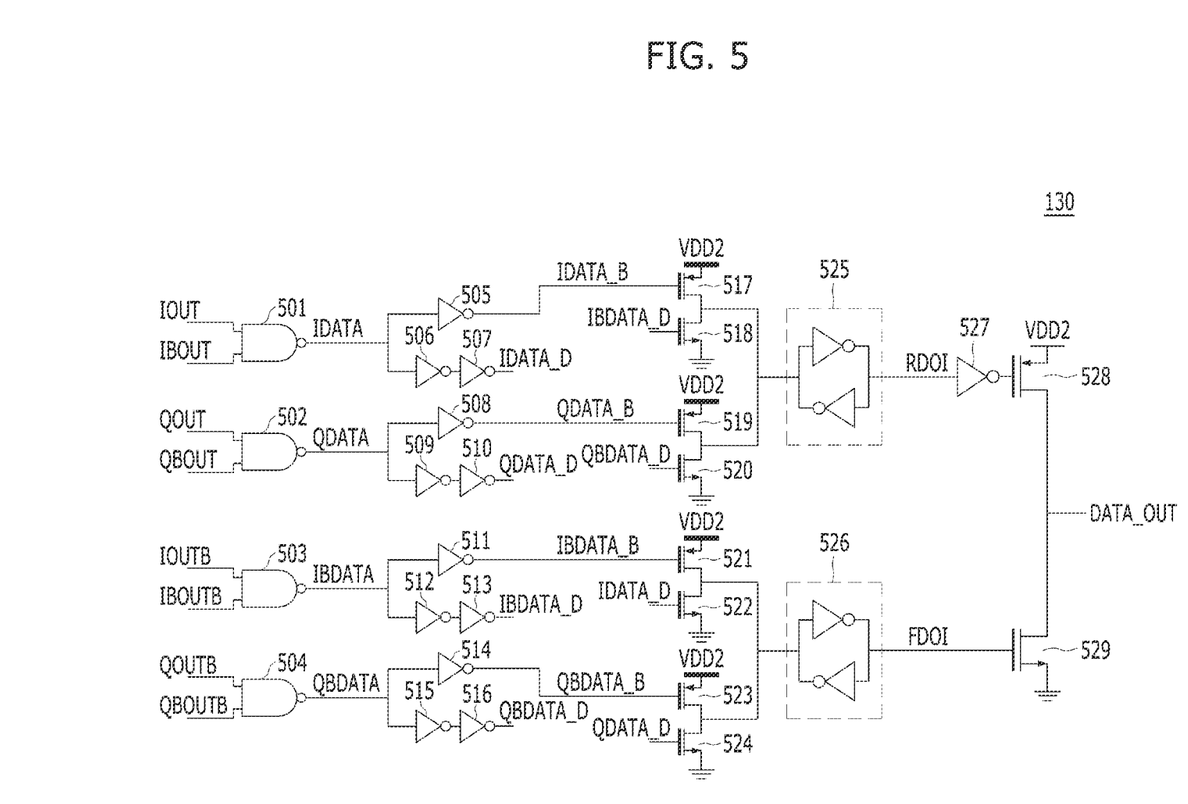
FIG. 5 is a configuration diagram of a parallel-to-serial conversion circuit 130 in FIG. 1 in accordance with an embodiment of the present disclosure.

FIG. 5 is a configuration diagram of the parallel-to-serial conversion circuit 130 in FIG. 1 in accordance with an embodiment of the present disclosure.

The parallel-to-serial conversion circuit 130 may perform a parallel-to-serial conversion operation of sequentially outputting the sampled data of the first to fourth data sampling circuits 120_0 to 120_3 to the output terminal DATA_OUT.

The parallel-to-serial conversion circuit 130 may include NAND gates 501 to 504, inverters 505 to 516 and 527, PMOS transistors 517, 519, 521, 523, and 528, NMOS transistors 518, 520, 522, 524, and 529, and latches 525 and 526.

The NAND gate 501 may receive the sampled data IOUT and IBOUT to generate data IDATA, the NAND gate 502 may receive the sampled data QOUT and QBOUT to generate data QDATA, the NAND gate 503 may receive the sampled data IOUTB and IBOUTB to generate data IBDATA, and the NAND gate 504 may receive the sampled data QOUTB and QBOUTB to generate data QBDATA.

The inverters 505, 508, 511, and 514 may invert the data IDATA, QDATA, IBDATA, and QBDATA to generate data IDATA_B, QDATA_B, IBDATA_B, and QBDATA_B, respectively. Furthermore, the inverters 506 and 507, 509 and 510, 512 and 513, and 515 and 516 may generate data IDATA_D, QDATA_D, IBDATA_D, and QBDATA_D having substantially the same logic levels as those of the data IDATA, QDATA, IBDATA, and QBDATA, respectively.

The PMOS transistors 517 and 519 may pull up an input terminal of the latch 525 in response to the data IDATA_B and QDATA_B. Furthermore, the PMOS transistors 521 and 523 may pull up an input terminal of the latch 526 in response to the data IBDATA_B and QBDATA_B.

The NMOS transistors 518 and 520 may pull down the input terminal of the latch 525 in response to the data IBDATA_D and QBDATA_D. Furthermore, the NMOS transistors 522 and 524 may pull down the input terminal of the latch 526 in response to the data IDATA_D and QDATA_D.

The inverter 527 may invert the signal of an output terminal RDOI of the latch 525, and the PMOS transistor 528 may pull up the output terminal DATA_OUT in response to an output signal of the inverter 527. Furthermore, the NMOS transistor 529 may pull down the output terminal DATA_OUT in response to the signal of an output terminal FDOI of the latch 526.

FIG. 6 illustrates the data IDATA, QDATA, IBDATA, and QBDATA, the signals of the output terminals RDOI and FDOI of the latches 525 and 526, and the data of the output terminal DATA_OUT. Referring to FIG. 6, it is possible to understand the process in which the first to fourth data DIIN, DQIN, DIBIN, and DQBIN are sampled by the first to fourth data sampling circuits 120_0 to 1203, and the process in which the sampled data IOUT, IOUTB, QOUT, QOUTB, IBOUT, IBOUTB, QBOUT, and QBOUTB become the data IDATA, QDATA, IBDATA, and QBDATA and are finally outputted serially to the output terminal DATA_OUT. In S0b, S1b, and the like of FIG. 6, b may indicate inversion. For example, S0b may be inverted data of S0.

Figure 7:
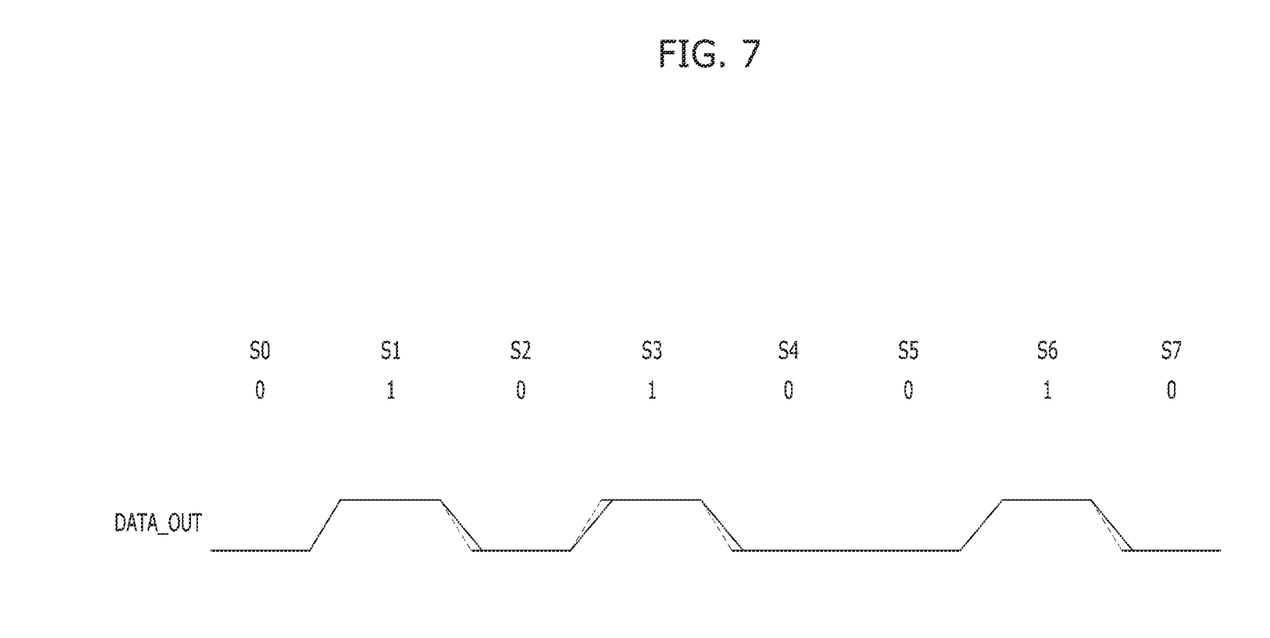
FIG. 7 is a diagram illustrating pre-emphasis driving at an output terminal DATA_OUT in accordance with an embodiment of the present disclosure.

FIG. 7 is a diagram illustrating pre-emphasis driving at the output terminal DATA_OUT in accordance with an embodiment of the present disclosure. It will be described with reference to FIG. 7 how the pre-emphasis driving is performed when data S0 to S7 are (0, 1, 0, 1, 0, 0, 1, 0).

The data S2 is sampled by the second data sampling circuit 1201, and since the pattern of the data S0 to S2 is (0, 1, 0), the speed control signal SLOWB of the second data sampling circuit 120_1 may be activated to '0'. Accordingly, the data S2 may be slowly sampled by the second data sampling circuit 120_1, and thus transition from the data S1 to the data S2 at the output terminal DATA_OUT may become slow as indicated by the solid line.

The data S3 is sampled by the third data sampling circuit 120_2, and since the pattern of the data S1 to S3 is (1, 0, 1), the speed control signal SLOWB of the third data sampling circuit 120_2 may be activated to '0'. Accordingly, the data S3 may be slowly sampled by the third data sampling circuit 120_2, and thus transition from the data S2 to the data S3 at the output terminal DATA_OUT may become slow as indicated by the solid line.

The data S4 is sampled by the fourth data sampling circuit 120_3, and since the pattern of the data S2 to S4 is (0, 1, 0), the speed control signal SLOWB of the fourth data sampling circuit 120_3 may be activated to '0'. Accordingly, the data S4 may be slowly sampled by the fourth data sampling circuit 120_3, and thus transition from the data S3 to the data S4 at the output terminal DATA_OUT may become slow as indicated by the solid line.

The data S7 is sampled by the third data sampling circuit 120_2, and since the pattern of the data S5 to S7 is (0, 1, 0), the speed control signal SLOWB of the third data sampling circuit 120_2 may be activated to '0'. Accordingly, the data S7 may be slowly sampled by the third data sampling circuit 120_2, and thus transition from the data S6 to the data S7 at the output terminal DATA_OUT may become slow as indicated by the solid line.

It can be seen that at the output terminal DATA_OUT, there is no change in the eye size of the data S0, S2, S3, S5, and S7, the eye size of the data S1 and S6 increases, and the eye size of the data S4 decreases. That is, it can be seen that time domain pre-emphasis driving, in which the eye size of the data S1 and S6 increases, is performed. Since the time when the pre-emphasis driving is required is the time (output time of S1 and S6) when the data DATA_OUT is changed from a low frequency to a high frequency, it can be considered that the pre-emphasis driving is performed at the time when the pre-emphasis driving is required. Although the eye size of the data S4 decreases, the output time of the data S4 is the time when the data DATA_OUT is changed from the high frequency to the low frequency. Therefore, a sufficient margin may be secured at a receiving terminal, which may cause no problem.

According to embodiments of the present disclosure, it is possible to implement pre-emphasis driving at an output terminal by adjusting the sampling speed of data with a simple configuration. Furthermore, by simply delaying the sampling speed of data in a period in which pre-emphasis driving is required, it is possible to improve the quality of transmission data without increasing current consumption.

Although the technical idea of the present disclosure has been specifically described according to the above preferred embodiment, it should be noted that the aforementioned embodiment is for the purpose of description and is not for limitation thereof. Furthermore, one of ordinary skill in the technical field of the present disclosure will appreciate that various embodiments can be made within the technical idea of the present disclosure and the following claims. Moreover, the embodiments may be combined to form additional embodiments.

What is claimed is:

1. A data sampling circuit comprising:
    a pattern detection circuit configured to generate a speed control signal by detecting a pattern of multibit data including input data; and
    a sampling circuit configured to
       sample the input data during an activation period of a sampling clock, and
       reduce an operating speed thereof when the speed control signal is activated.

2. The data sampling circuit of claim 1, wherein the sampling circuit reduces the operating speed by decreasing an amount of operating current of the sampling circuit.

3. The data sampling circuit of claim 1, wherein the pattern detection circuit generates the speed control signal when the pattern of the multibit data matches one of preset patterns.

4. The data sampling circuit of claim 3, wherein the preset patterns include a toggling pattern.

5. The data sampling circuit of claim 1, wherein the sampling circuit comprises:
    an input unit configured to sink current from an output bar node to a common source node in response to the input data;
    an input bar unit configured to sink current from an output node to the common source node in response to data obtained by inverting the input data;
    a first pull-up driving unit configured to pull up the output node in response to a voltage level of the output bar node;
    a second pull-up driving unit configured to pull up the output bar node in response to a voltage level of the output node;
    a first sinking unit configured to sink current from the common source node to a ground terminal; and
    a second sinking unit activated when the speed control signal is deactivated and configured to sink current from the common source node to the ground terminal.

6. The data sampling circuit of claim 5, wherein the first pull-up driving unit, the second pull-up driving unit, the first sinking unit, and the second sinking unit are activated during the activation period of the sampling clock.

7. The data sampling circuit of claim 6, wherein the output node and the output bar node are equalized during a deactivation period of the sampling clock.

8. A data transmitter circuit comprising:
    a plurality of pattern detection circuits configured to generate a plurality of speed control signals by detecting a pattern of multibit data;
    a plurality of sampling circuits configured to
       sample the multibit data respectively corresponding to the plurality of sampling circuits during activation periods of sampling clocks respectively corresponding to the plurality of sampling circuits, and
       reduce respective operating speeds of the sampling circuits when respective speed control signals corresponding to the sampling circuits are activated; and
    a parallel-to-serial conversion circuit configured to perform parallel-to-serial conversion on the sampled data to output the converted data to an output node.

9. The data transmitter circuit of claim 8, wherein each of the sampling circuits reduces the operating speed thereof by decreasing, when a corresponding speed control signal of the speed control signals is activated, an amount of operating current thereof.

10. The data transmitter circuit of claim 8, wherein each of the plurality of sampling circuits comprises:
    an input unit configured to sink current from an output bar node to a common source node in response to input data corresponding to each of the plurality of sampling circuits among the multibit data;
    an input bar unit configured to sink current from an output node to the common source node in response to data obtained by inverting the input data corresponding to each of the plurality of sampling circuits among the multibit data;
    a first pull-up driving unit configured to pull up the output node in response to a voltage level of the output bar node;
    a second pull-up driving unit configured to pull up the output bar node in response to a voltage level of the output node;
    a first sinking unit configured to sink current from the common source node to a ground terminal; and
    a second sinking unit activated when a corresponding speed control signal of the speed control signals is deactivated, and configured to sink current from the common source node to the ground terminal.

11. The data transmitter circuit of claim 10, wherein the first pull-up driving unit, the second pull-up driving unit, the first sinking unit, and the second sinking unit are activated during the activation period of the corresponding sampling clock.

12. The data transmitter circuit of claim 11, wherein the output node and the output bar node are equalized during a deactivation period of the corresponding sampling clock.

13. A data transmitter circuit comprising:
first to fourth pattern detection circuits configured to activate first to fourth speed control signals by using first to fourth data corresponding to the first to fourth pattern detection circuits, respectively, each piece of the first to fourth data being multibit;
a first sampling circuit configured to sample the first data during an activation period of a first sampling clock and reduce an operating speed of the first sampling circuit when the first speed control signal is activated;
a second sampling circuit configured to sample the second data during an activation period of a second sampling clock and reduce an operating speed of the second sampling circuit when the second speed control signal is activated;
a third sampling circuit configured to sample the third data during an activation period of a third sampling clock and reduce an operating speed of the third sampling circuit when the third speed control signal is activated;
a fourth sampling circuit configured to sample the fourth data during an activation period of a fourth sampling clock and reduce an operating speed of the fourth sampling circuit when the fourth speed control signal is activated; and
a parallel-to-serial conversion circuit configured to perform parallel-to-serial conversion on the sampled data to output the converted data to an output node.

14. The data transmitter circuit of claim 13, wherein the first pattern detection circuit activates the first speed control signal when the first data and the fourth data are different from each other, and the fourth data and the third data are different from each other,
wherein the second pattern detection circuit activates the second speed control signal when the second data and the first data are different from each other, and the first data and the fourth data are different from each other,
wherein the third pattern detection circuit activates the third speed control signal when the third data and the second data are different from each other, and the second data and the first data are different from each other, and
wherein the fourth pattern detection circuit activates the fourth speed control signal when the fourth data and the third data are different from each other, and the third data and the second data are different from each other.

15. The data transmitter circuit of claim 13, wherein activation periods of the respective first to fourth sampling clocks do not overlap one another.

16. The data transmitter circuit of claim 13, wherein each of the first to fourth sampling circuits reduces the operating speed thereof by decreasing, when the corresponding speed control signal among the first to fourth speed control signals is activated, an amount of operating current thereof.

17. The data transmitter circuit of claim 13, wherein swing widths of the first to fourth data and the first to fourth sampling clocks are different from swing widths of the data sampled by the first to fourth sampling circuits.

18. The data transmitter circuit of claim 13, wherein each of the first to fourth sampling circuits comprises:
an input unit configured to sink current from an output bar node to a common source node in response to input data corresponding to each of the first to fourth sampling circuits among the first to fourth data;
an input bar unit configured to sink current from an output node to the common source node in response to data obtained by inverting input data corresponding to each of the first to fourth sampling circuits among the first to fourth data;
a first pull-up driving unit configured to pull up the output node in response to a voltage level of the output bar node;
a second pull-up driving unit configured to pull up the output bar node in response to a voltage level of the output node;
a first sinking unit configured to sink current from the common source node to a ground terminal; and
a second sinking unit activated when a corresponding speed control signal of the first to fourth speed control signals is deactivated and configured to sink current from the common source node to the ground terminal.

19. The data transmitter circuit of claim 18, wherein the first pull-up driving unit, the second pull-up driving unit, the first sinking unit, and the second sinking unit are activated during the activation period of the corresponding sampling clock.

20. The data transmitter circuit of claim 19, wherein the output node and the output bar node are equalized during a deactivation period of the corresponding sampling clock.

* * * * *